(12) United States Patent
Otremba et al.

(10) Patent No.: US 7,569,920 B2
(45) Date of Patent: Aug. 4, 2009

(54) ELECTRONIC COMPONENT HAVING AT LEAST ONE VERTICAL SEMICONDUCTOR POWER TRANSISTOR

(75) Inventors: Ralf Otremba, Kaufbeuren (DE); Klaus Schiess, Allensbach (DE)

(73) Assignee: Infineon Technologies AG, Munich (DE)

( * ) Notice: Subject to any disclaimer, the term of this patent is extended or adjusted under 35 U.S.C. 154(b) by 395 days.

(21) Appl. No.: 11/382,594

(22) Filed: May 10, 2006

(65) Prior Publication Data

US 2007/0262346 A1 Nov. 15, 2007

(51) Int. Cl.
| | |
|---|---|
| *H01L 23/48* | (2006.01) |
| *H01L 31/111* | (2006.01) |
| *H01L 23/495* | (2006.01) |
| *H01L 23/02* | (2006.01) |
| *H01L 23/34* | (2006.01) |
| *H05K 3/34* | (2006.01) |
| *H05K 1/11* | (2006.01) |

(52) U.S. Cl. ............................. 257/686; 257/E23.085; 257/E23.01; 257/E23.124; 257/E25.018; 257/E23.044; 257/E23.034; 257/E25.027; 257/E23.047; 257/E23.021; 257/E25.015; 257/E23.026; 257/E23.071; 257/E23.063; 257/177; 257/777; 257/723; 257/685; 257/684; 257/796; 257/666; 257/778; 257/784; 257/786; 257/692; 257/693; 257/713; 257/728; 257/678

(58) Field of Classification Search ................. 257/678, 257/686, 685, 723, 777, 684, 796, 177, 690, 257/691, 692, 693, 696, 698, 666, 778, 786, 257/784, 774, 712, 713, 717, 720, 728, E28.085, 257/E23.01, E25.018, E23.044, E25.027, 257/E23.047, E23.052, E23.021, E23.034, 257/E25.015, E23.026, E23.071, E23.085, 257/E23.063, E23.124
See application file for complete search history.

(56) References Cited

U.S. PATENT DOCUMENTS 4,685,210 A * 8/1987 King et al. ..................... 29/830

(Continued)

FOREIGN PATENT DOCUMENTS

| DE | 19635582 C1 | 2/1998 |
|---|---|---|
| DE | 102004021054 A1 | 11/2005 |

*Primary Examiner*—Alexander O Williams
(74) *Attorney, Agent, or Firm*—Banner & Witcoff, Ltd.

(57) ABSTRACT

An electronic component includes a vertical semiconductor power transistor and a further semiconductor device arranged on the transistor to form a stack. The first vertical semiconductor power transistor has a semiconductor body having a first side and a second side and device structures, at least one first electrode positioned on the first side and at least one second electrode positioned on the second side. The semiconductor body further has at least one electrically conductive via. The via extends from the first side to the second side of the semiconductor body and is galvanically isolated from the device structures of the semiconductor body and from the first electrode and the second electrode.

30 Claims, 2 Drawing Sheets

U.S. PATENT DOCUMENTS

| | | | |
|---|---|---|---|
| 5,608,264 A | 3/1997 | Gaul | 257/734 |
| 6,031,279 A | 2/2000 | Lenz | 257/686 |
| 6,706,557 B2 | 3/2004 | Koopmans | 438/109 |
| 6,838,310 B1 | 1/2005 | Hsuan | 438/106 |
| 6,936,913 B2 | 8/2005 | Akerling et al. | 257/686 |
| 7,271,470 B1 * | 9/2007 | Otremba | 257/666 |
| 7,342,267 B2 * | 3/2008 | Kajiwara et al. | 257/288 |
| 2002/0074637 A1 | 6/2002 | McFarland | 257/686 |
| 2003/0098468 A1 * | 5/2003 | Wheeler et al. | 257/200 |
| 2007/0215996 A1 * | 9/2007 | Otremba | 257/678 |
| 2007/0219033 A1 * | 9/2007 | Otremba | 474/213 |
| 2007/0222044 A1 * | 9/2007 | Otremba | 257/678 |
| 2007/0259514 A1 * | 11/2007 | Otremba | 438/612 |
| 2007/0266558 A1 * | 11/2007 | Otremba | 29/840 |
| 2007/0290337 A1 * | 12/2007 | Otremba et al. | 257/737 |
| 2008/0006923 A1 * | 1/2008 | Otremba | 257/686 |
| 2008/0087913 A1 * | 4/2008 | Otremba et al. | 257/177 |

* cited by examiner

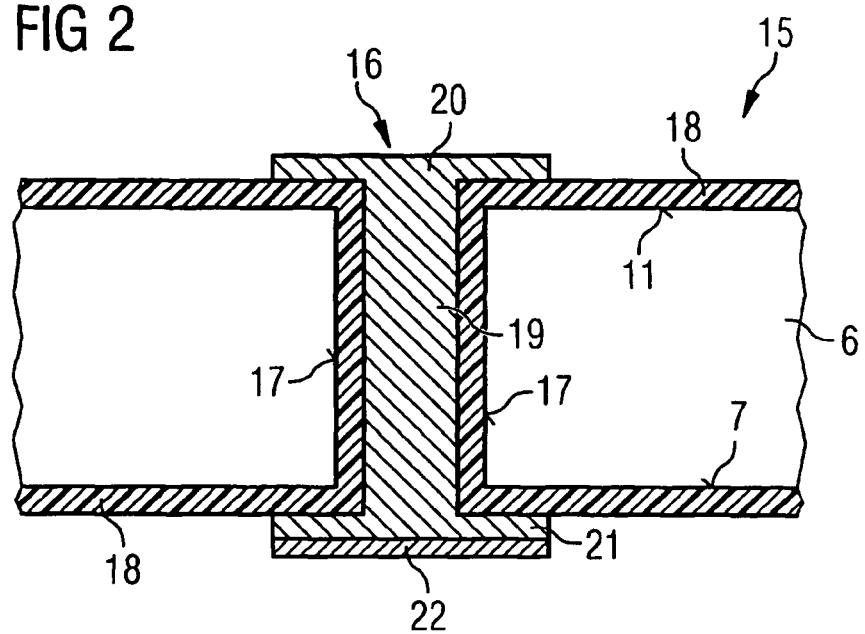
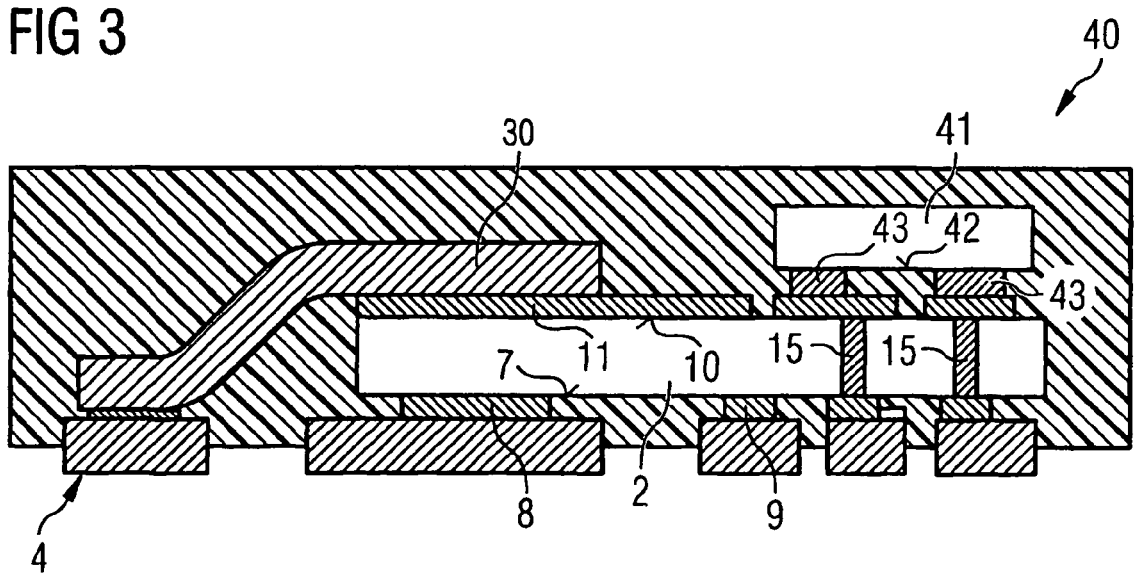

ELECTRONIC COMPONENT HAVING AT LEAST ONE VERTICAL SEMICONDUCTOR POWER TRANSISTOR

TECHNICAL FIELD

The application relates to an electronic component and, in particular, to an electronic component comprising at least one vertical semiconductor power device and a further semiconductor component arranged in a stack and to methods for producing an electronic component.

BACKGROUND

In order to improve the performance of electronic components, multi-chip modules are increasingly being provided in which two or more semiconductor devices are packaged within a single component housing. In order to reduce the footprint or lateral dimensions of the electronic component, the semiconductor components may be stacked one on top of the other.

In the case of vertical semiconductor devices, such as vertical semiconductor power transistors, for example MOSFETs and IGBTs, stacking of a further semiconductor component is complicated as both the top and bottom side of the device comprise one or more electrodes which are electrically accessed. Typically, it is desired to electrically access both sides of the vertical device from one side of the electronic component, such as a leadframe or rewiring substrate on which the device is mounted. Consequently, a further electrical connection such a bond wire or contact clip has to be provided from the side of the vertical semiconductor device which faces away from the substrate. However, the second semiconductor component is also mounted on this second side to form a stack. As a result, the size of the second semiconductor component which can be mounted on the vertical semiconductor power transistor is limited and the rewiring structure within the component housing is complicated.

It is, therefore, desirable to provide an electronic component in which a stack comprising a vertical semiconductor power transistor can be more easily accommodated.

SUMMARY

An electronic component comprises two vertical semiconductor power transistors arranged in a stack. A first vertical semiconductor power transistor comprises a semiconductor body having a first side and a second side and device structures, at least one first electrode positioned on the first side and at least one second electrode positioned on the second side. The semiconductor body further comprises at least one electrically conductive via, the via extending from the first side to the second side of the semiconductor body and being galvanically isolated from the device structures of the semiconductor body and from the first electrode and the second electrode. A second vertical semiconductor power transistor comprises a semiconductor body having a first side and a second side and device structures, at least one first electrode and at least one control electrode positioned on the first side and at least one second electrode positioned on the second side. The second vertical semiconductor power transistor is mounted on the second side of the first vertical semiconductor power transistor such that at least one electrode of the second semiconductor transistor is mounted on, and electrically connected to, the via positioned in the first semiconductor power transistor. The electrode of the second semiconductor power transistor is galvanically isolated from the first semiconductor power transistor and is independently electrically accessible from the first side of the first semiconductor power transistor.

An electronic component comprises at least one first vertical semiconductor power transistor and a control semiconductor chip. The vertical semiconductor power transistor comprises a semiconductor body having a first side and a second side and device structures, at least one first electrode and at least one control electrode positioned on the first side and at least one second electrode positioned on the second side. The semiconductor body further comprises at least one electrically conductive via, the via extending from the first side to the second side of the semiconductor body and being galvanically isolated from the device structures of the semiconductor body and from the first electrode, the second electrode and the control electrode. The control semiconductor chip comprises at least one chip contact positioned on a first chip surface. The control semiconductor chip is mounted on the second side of the first vertical semiconductor transistor and the chip contact is mounted on and electrically connected to at least one via. The control semiconductor chip is independently electrically accessible from the first side of the first vertical semiconductor power transistor.

A semiconductor die comprises a vertical semiconductor power transistor. The vertical semiconductor power transistor comprises a semiconductor body having a first side and a second side and device structures, at least one first electrode and at least one control electrode positioned on the first side and at least one second electrode positioned on the second side. The semiconductor body further comprises at least one electrically conductive via. The via extends from the first side to the second side of the semiconductor body and is galvanically isolated from the device structures of the semiconductor body and from the first electrode, the second electrode and the control electrode.

A method to manufacture a vertical semiconductor power transistor comprises providing a first vertical semiconductor power transistor wherein the first vertical semiconductor power transistor comprises semiconductor body having a first side and a second side and device structures, at least one first electrode and at least one control electrode positioned on the first side, at least one second electrode positioned on the second side. At least one electrically conductive via is formed in the semiconductor body so that the via extends from the first side to the second side of the semiconductor body and is galvanically isolated from the device structures of the semiconductor body and from the first electrode, the second electrode and the control electrode.

A method to manufacture an electronic component comprises providing at least one first vertical semiconductor power transistor. The vertical semiconductor power transistor comprises a semiconductor body having a first side and a second side and device structures, at least one first electrode and at least one control electrode positioned on the first side and at least one second electrode positioned on the second side. The semiconductor body further comprises at least one electrically conductive via, the via extending from the first side to the second side of the semiconductor body and being galvanically isolated from the device structures of the semiconductor body from the first electrode, the second electrode and the control electrode. An electrically conductive redistribution structure is provided which provides outer contact surfaces of the electronic component. The first electrode, the control electrode and the second electrode to the outer contact surfaces of the electronic component.

BRIEF DESCRIPTION OF THE FIGURES

FIG. 2 illustrates a cross-sectional view of an electrically conductive via, and FIG. 3 illustrates cross-sectional view of an electronic component including one vertical semiconductor power transistor and a control semiconductor chip.

DETAILED DESCRIPTION

Figure 1:
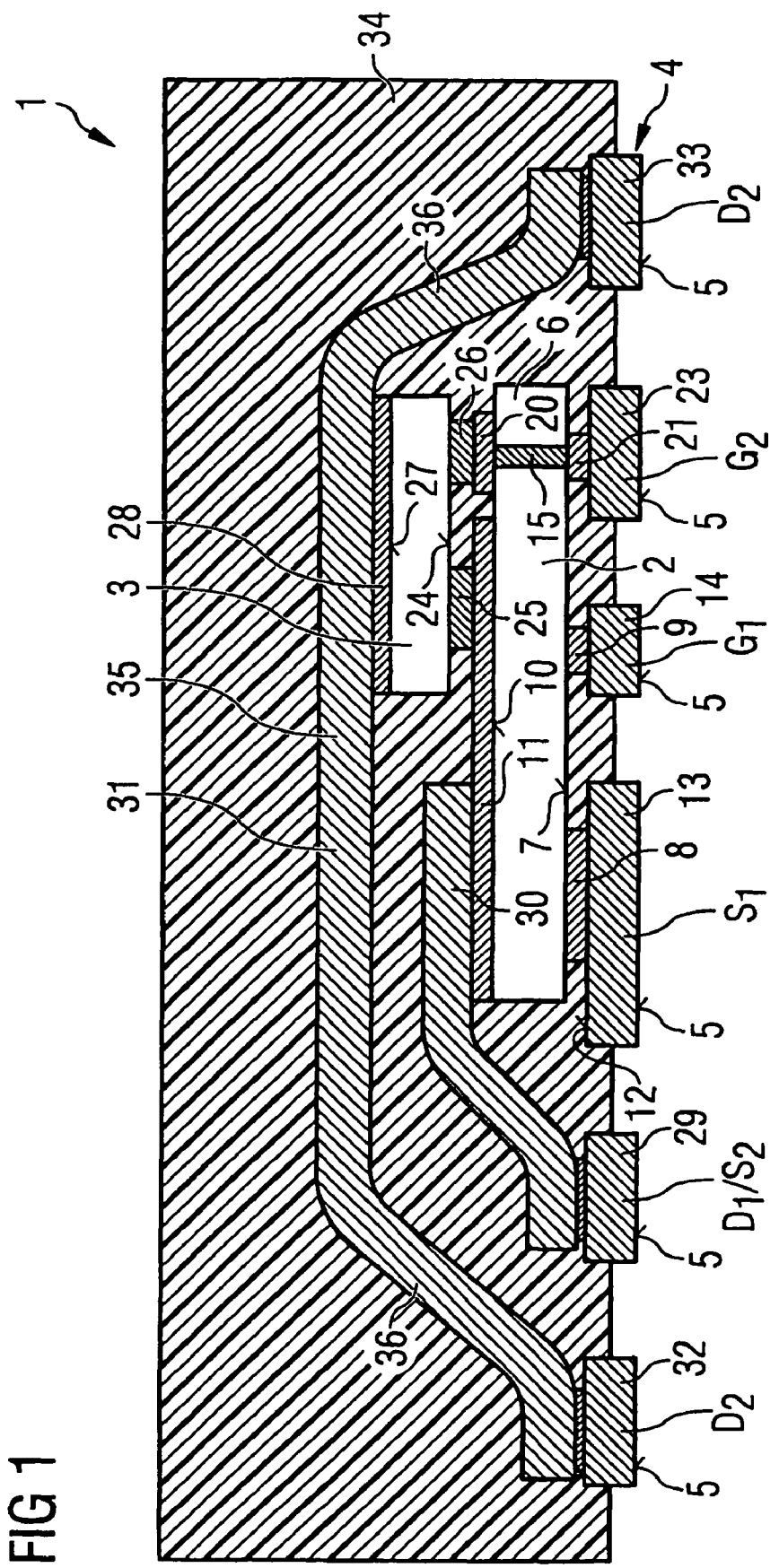
FIG. 1 illustrates a cross-sectional view of an electronic component including two vertical semiconductor power transistors arranged to provide a half printed circuit.

An electronic component comprises two vertical semiconductor power transistors arranged in a stack.

A first vertical semiconductor power transistor comprises a semiconductor body having a first side and a second side and device structures, at least one first electrode positioned on the first side and at least one second electrode positioned on the second side. The semiconductor body further comprises at least one electrically conductive via. The via extends from the first side to the second side, which opposes the first side, of the semiconductor body and is galvanically isolated from the device structures of the semiconductor body and from the first electrode and the second electrode.

A second vertical semiconductor power transistor comprises a semiconductor body having a first side and a second side and device structures, at least one first electrode and at least one control electrode positioned on the first side and at least one second electrode positioned on the second side.

The second vertical semiconductor power transistor is mounted on the second side of the first vertical semiconductor power transistor such that at least one electrode of the second semiconductor transistor is mounted on, and electrically connected to, the via positioned in the first semiconductor power transistor. The electrode of the second semiconductor power transistor is galvanically isolated from the first semiconductor power transistor and is independently electrically accessible from the first side of the first semiconductor power transistor.

A stack comprising two vertical semiconductor power transistors is, therefore, provided in which a rewiring structure enabling the upper second vertical semiconductor power transistor to be accessed formed the first side of the first semiconductor power transistor is provided in the form of a via positioned in the first semiconductor power transistor. The electrically conductive via is, however, galvanically isolated from the device structures of the first semiconductor power transistor and from the first electrode and second electrode of the first semiconductor power transistor. Therefore, the electrode of the second vertical semiconductor power transistor, which is mounted on the electrically conductive via, is electrically accessible from the first side of the first semiconductor power transistor by means of the via independently of any electrical contacting to the first semiconductor power transistor in which the via is situated.

Device structures is used in this context to refer to regions of the semiconductor body which have been doped to provide a higher or lower conductivity of either an n-type or a p-type conductivity.

The arrangement of the via provides a rewiring structure which does not occupy space within the electronic component adjacent to the two vertical power transistor devices as is the case with a bond wire or contact clip. Consequently, the lateral size of the first semiconductor power transistor can be increased to occupy the space which is no longer required to accommodate an additional bond wire or contact clip. Since the performance of a vertical power transistor is dependent on its lateral size, it is possible to improve the performance delivered by the component.

The assembly of the stack of two power transistors is simplified as the electrical rewiring of the electrode of the second semiconductor power transistor is produced at the same time as the second semiconductor power transistor is mounted on the first semiconductor power transistor. A subsequent step in which an electrical connection is made from the electrode of the second semiconductor to an outer contact area of a leadframe or rewiring substrate is no longer required.

The second semiconductor power switch which is arranged at the top of the stack may be provided without at least one electrically conductive via in order to reduce manufacturing costs.

In an embodiment, at least one control electrode is positioned on the first side of the first semiconductor transistor and the second vertical semiconductor power transistor is mounted on the second side of the first vertical semiconductor power transistor. The first electrode of the second semiconductor power transistor is mounted on, and electrically connected to, the second electrode of the first semiconductor power transistor and the control electrode of the second semiconductor power transistor is mounted on, and electrically connected to, the via. The two power transistors are, in an embodiment of the same conductivity type, i.e. both transistor devices are n-type devices of p-type devices.

The control electrode of the second semiconductor power transistor is galvanically isolated from the first semiconductor power transistor on which it is mounted. This enables the control electrode to be electrically accessed independently from the electrical accessing of the electrodes of the first semiconductor power transistor.

This arrangement of the two vertical semiconductor power transistors provides a stack which provides the basis for a half-bridge circuit. In further embodiments, the electronic component may comprise two or more stacks of two vertical semiconductor power transistors in order to provide a full-bridge circuit and/or an electronic component with multiphase switching capabilities.

In an embodiment, the first vertical semiconductor power transistor and the second vertical semiconductor power transistor are configured to provide a half-bridge circuit. The first and second vertical semiconductor power transistors may both comprise n-channel devices or, in an alternative embodiment, may both comprise p-channel devices.

In an embodiment, the first vertical semiconductor power transistor is the Low Side Switch and the second vertical semiconductor power transistor is the High Side Switch of the half bridge circuit. In the case where both the first and second vertical semiconductor power transistors are n-channel devices, the first vertical semiconductor power transistor is mounted with its first side facing downwards towards the lower side of the electronic component. The first electrode of an n-channel power transistor, is the ground electrode. This arrangement, therefore, provides a stack in which the second electrode faces upwards towards the upper surface of the electronic component for improved top side cooling. Heat generated is dissipated more efficiently upwards away from the printed circuit board, thus avoiding overheating of the printed circuit board and neighbouring devices mounted on the printed circuit board.

In an embodiment, the first vertical semiconductor power transistor is one of a MOSFET (Metal Oxide Semiconductor Field Effect Transistor), a IGBT (Isolated Gate Bipolar Transistor) and a BJT (Bipolar Junction Transistor)and the second vertical semiconductor power transistor is one of a MOSFET, a IGBT and a BJT.

For a MOSFET device, the first electrode is normally called a source electrode, the second electrode a drain electrode and the control electrode a gate electrode. For a BJT device, the first electrode is an emitter electrode, the second electrode is a collector electrode and the control electrode is a base electrode. For a IGBT device, the first electrode is an emitter electrode, the second electrode is a collector electrode and the control electrode is a gate electrode.

In an embodiment, the electronic component further comprises a leadframe. The leadframe provides the outer contact surfaces of the electronic component. The first electrode of the first vertical semiconductor power transistor is mounted on a first portion of the leadframe and the control electrode of the first semiconductor power transistor is mounted on a first control portion of the leadframe. The via is mounted on a second control electrode portion of the leadframe. The various portions of the leadframe are physically separate, and electrically isolated from each other.

The second control portion of the leadframe enables the control electrode of the second semiconductor power transistor to be accessed from outside of the package and independently from the electrical access to the first semiconductor power transistor. This second control portion of the leadframe is, therefore, positioned directly under the first semiconductor power transistor. This enables a first semiconductor power transistor to be accommodated on the leadframe which has lateral dimensions larger than the footprint of the portion of the leadframe from which it is electrically accessed. The first semiconductor power transistor is provided with lateral dimensions or a footprint which extends to the second control portion. The lower first vertical semiconductor power transistor is mechanically supported on the second control portion although it remains galvanically isolated from the second control portion.

The second electrode of the second semiconductor transistor may be mounted on, and electrically connected to, the first electrode of the first vertical semiconductor power transistor. The control electrode of the second semiconductor transistor is, in this embodiment, mounted on, and electrically connected to, the via positioned in the first semiconductor power transistor and is electrically connected to the second control portion of the leadframe.

The electronic component may further comprise an electrical connection from the second electrode of the first semiconductor power transistor to a second portion of the leadframe and an electrical connection from the second electrode of the second semiconductor power transistor to a third portion of the leadframe to provide a half bridge circuit.

The lower surfaces of the portions of the leadframe may provide surface mountable contact surfaces of the electronic component. Alternatively, the leadframe comprises lead fingers which extend from one or more side faces of the plastic encapsulation material of the electronic component.

In an embodiment, the electrically conductive via comprises a through-hole positioned in the semiconductor body extending from the first side to the second side and an electrically conductive mass located in the through-hole and extending from the first side to the second side. These electrically conductive vias may be fabricated using a method according to U.S. Pat. No. 5,608,264 issued to Gaul which is hereby incorporated by reference in its entirety.

In an embodiment, the via further comprises at least one isolation layer positioned on at least the walls of the though-hole. The isolation layer galvanically isolates the electrically conductive mass positioned within the through-hole from the device structures of the semiconductor body as well as from the first electrode, second electrode and control electrode of the first semiconductor power transistor.

In an embodiment, the isolation layer provides a galvanic isolation voltage in the range from 10V to 10 kV. The thickness of the isolation layer may be varied in order to provide the isolation voltage. The isolation layer may comprise a thickness t, wherein $10 \text{ nm} \leq t \leq 10 \text{ μm}$, preferably $100 \text{ nm} \leq t \leq 1 \text{ μm}$.

The isolation layer may comprise an oxide, nitride or a glass. The isolation layer may comprise $SiO_2$, SiNO, BPSG (boro phosphate silicate glass) or $Si_xH_x$ or TEOS (Tetra Eythly Ortho Silane).

In an embodiment, the isolation layer is further positioned on the first side and the second side of the semiconductor body at least in regions contiguous to the through-hole. This increases the galvanic isolation between the electrically conductive via and the electrode of the second semiconductor power switch which is mounted on one end of the via. Additionally, this arrangement increases the galvanic isolation between the electrically conductive via and the portion of the leadframe on which it is mounted. This improves the reliability of the electronic module.

In an embodiment, the via comprises one of aluminium, an aluminium alloy, copper and a copper alloy. The electrically conductive metal may be provided in the form of a coating positioned on the side walls of the through-hole or on the side walls of the isolation layer, if one is provided. Alternatively, the electrically conductive metal may be provided in the form of a solid contact having the form of a filament or rod which essentially fills the through-hole.

In an embodiment, a first contact pad is positioned on the first surface and is in physical and electrical contact with the via and a second contact pad is positioned on the second surface and is in physical and electrical contact with the via. The provision of the contact pads as the advantage that the contact area between the electrode of the second semiconductor power transistor and the via and/or the contact area between the via and the leadframe is increased. This reduces the contact resistance as well as simplifying the mounting process.

In a further embodiment, the electronic component comprises a first vertical semiconductor power transistor and a control semiconductor chip arranged in a stack.

The vertical semiconductor power transistor comprises a semiconductor body having a first side and a second side and device structures, at least one first electrode and at least one control electrode positioned on the first side and at least one second electrode positioned on the second side. The semiconductor body further comprises at least one electrically conductive via, the via extending from the first side to the second side of the semiconductor body and being galvanically isolated from the device structures of the semiconductor body and from the first electrode, the second electrode and the control electrode.

The control semiconductor chip comprises at least one chip contact positioned on a first chip surface. The control semiconductor chip is mounted on the second side of the first vertical semiconductor transistor and the chip contact is mounted on, and electrically connected to, at least one via. The control semiconductor chip is independently electrically accessible from the first side of the first vertical semiconductor power transistor.

The electronic component according to this embodiment, therefore, provides a multi-chip module which includes a vertical semiconductor power transistor and a semiconductor control chip. The electrically conductive via positioned in the vertical semiconductor power transistor may be formed according to one of the embodiments previously described.

The rewiring structure between the semiconductor control chip and the first side of the vertical semiconductor power transistor is provided by the via positioned in the semiconductor transistor. The via is positioned underneath the control semiconductor chip. Therefore, space is saved within the electronic component adjacent to the vertical semiconductor power transistor and the control semiconductor chip as additional bond wires are no longer required to electrically connect the control semiconductor chip to a leadframe or a rewiring substrate of the electronic component.

In an embodiment of the invention, the control semiconductor chip comprises a plurality of electrical contacts in the form of raised contacts or in the form of flip-chip bumps. A plurality of electrically conductive vias are provided in a first vertical semiconductor power transistor which have a number and a lateral arrangement which corresponds to the number and lateral arrangement of the contacts on the control semiconductor chip.

An embodiment, the electronic component comprising a vertical semiconductor power transistor and a control semiconductor chip further comprises a leadframe. The leadframe provides outer contact surfaces of the electronic component. The first electrode of the first vertical semiconductor power transistor is mounted on a first portion of the leadframe and the control electrode of the first semiconductor power transistor is mounted on a control portion of the leadframe. The electrically conductive via is mounted on a fourth portion of the leadframe, electrically connecting the control chip to the fourth portion of the leadframe.

The control chip can, therefore, be electrically accessed from outside of the electronic component from the fourth portion of the leadframe, the rewiring structure comprising the fourth portion of the leadframe and the electrically conductive via. Since the electrically conductive via is galvanically isolated from the device structures and electrodes of the first vertical semiconductor power transistor, the control chip can be electrically accessed independently.

If two or more electrically conductive vias are provided in the first semiconductor power transistor, the leadframe may comprise a corresponding number of portions so that each contact all the control chip may be independently electrically accessed from its own portion of the leadframe.

The application also relates to methods of manufacturing a vertical semiconductor power transistor with an electrically conductive via which is galvanically isolated from the integrated circuit devices and electrodes of the power transistor in which it is positioned.

A method comprises providing a first vertical semiconductor power transistor wherein the first vertical semiconductor power transistor comprises a semiconductor body having a first side and a second side and device structures. At least one first electrode and at least one control electrode positioned on the first side and at least one second electrode positioned on the second side is provided. At least one electrically conductive via is formed in the semiconductor body so that the via extends from the first side to the second side of the semiconductor body and is galvanically isolated from the device structures of the semiconductor body and from the first electrode, the second electrode and the control electrode.

A through-hole may formed in the semiconductor body to provide a via. The through-hole may be formed by one of etching and laser ablation.

An isolation layer may deposited on at least the side walls of the through-hole formed in the semiconductor body to provide the via. In an embodiment, an electrically conductive mass is deposited on at least the side walls of the through-hole to provide an electrically conductive via. The electrically conductive mass may have the form of a layer. Alternatively, the through-hole is essentially filled with an electrically conductive mass to provide an electrically conductive via.

In an embodiment, a first contact pad is deposited on the first surface in physical and electrical contact with the via and a second contact pad is deposited on the second surface in physical and electrical contact with the via.

The isolation layer, electrically conductive mass and first and second contact pads may be deposited by vacuum deposition techniques such as sputtering, thermal evaporation, chemical vapour deposition, or electronic beam evaporation. Galvanic deposition may be used to deposit the electrically conductive mass.

In an embodiment of the invention, a layer of diffusion solder is deposited on the outermost surface of the first contact pad. This enables the first contact pad to be mounted on, and electrically connected to, a substrate using a diffusion solder process. The substrate may be a leadframe or a rewiring substrate of the electronic component. Alternatively, the substrate may be a printed circuit board which is external to the electronic component.

Diffusion solder provides a diffusion solder bond which comprises intermetallic phases having a higher melting temperature than the temperature at which the diffusion bond is formed. Therefore, if subsequent solder reflow operations are carried out to provide further electrical connections between the transistor and a substrate or printed circuit board, the diffusion solder bond attaching the contact pad and via to the substrate does not melt. A thermally and mechanically stable electrical connection is, therefore, provided.

The application also relates to methods of assembling an electronic component comprising a vertical semiconductor power transistor with an electrically conductive via according to one of the embodiments previously described.

A method comprises providing at least one first vertical semiconductor power transistor. The vertical semiconductor power transistor comprising a semiconductor body having a first side and a second side and device structures, at least one first electrode and at least one control electrode positioned on the first side and at least one second electrode positioned on the second side. The semiconductor body further comprises at least one electrically conductive via. The via extends from the first side to the second side of the semiconductor body and is galvanically isolated from the device structures of the semiconductor body from the first electrode, the second electrode and the control electrode. An electrically conductive redistribution structure is provided. The first electrode, the control electrode and the second electrode of the vertical semiconductor power transistor are electrically connected to outer contact surfaces of the electronic component.

In an embodiment, a second vertical semiconductor power transistor is provided which comprises a semiconductor body having a first side and a second side and device structures, at least one first electrode and at least one control electrode positioned on the first side and at least one second electrode positioned on the second side. The second vertical semiconductor power transistor is mounted on the first vertical semiconductor power transistor to provide a half-bridge circuit. The control electrode of the second semiconductor transistor is mounted on, and electrically connected to, the via positioned in the first semiconductor power transistor.

A leadframe may be provided, the leadframe providing outer contact surfaces of the electronic component. The first electrode of the first vertical semiconductor power transistor is mounted on a first portion of the leadframe, the control electrode of the first semiconductor power transistor is mounted on a control portion of the leadframe and the via is mounted on a second control electrode portion of the leadframe.

After the first semiconductor power transistor is mounted on the leadframe, the second semiconductor power transistor may be stacked on the first semiconductor power transistor. The second electrode of the second semiconductor transistor is mounted on, and electrically connected to, the first electrode of the first vertical semiconductor power transistor and the control electrode of the second semiconductor transistor is mounted on, and electrically connected to, the via positioned in the first semiconductor power transistor and is electrically connected to the second control portion of the leadframe.

In an embodiment, a control semiconductor chip is provided. The control semiconductor chip comprises at least one chip contact positioned on a first chip side. The control semiconductor chip is mounted on the second side of the first vertical semiconductor transistor and is electrically connected to at least one via.

A leadframe may also be provided in this embodiment. The first electrode of the first vertical semiconductor power transistor is mounted on a first portion of the leadframe and the control electrode of the first semiconductor power transistor is mounted on a control portion of the leadframe. The electrically conductive via is mounted on a fourth portion of the leadframe to electrically connect the control chip to the fourth portion of the leadframe.

FIG. 1 illustrates an electronic component 1 comprising two vertical n-channel power MOSFET devices 2, 3 configured to provide a half-bridge circuit. The electronic component 1 further comprises a leadframe 4 which provides surface mountable outer surfaces 5 of the electronic component 1 positioned in the lower surface of the electronic component 1.

The first MOSFET device 2 comprises a semiconductor body 6 with a first side 7 comprising a source electrode 8 and a gate electrode 9 and a second side 10 which opposes the first surface 7 and comprises a drain electrode 11. The first MOSFET device 2 provides the Low Side Switch of the half-bridge circuit and is arranged with its first side 7 facing towards the upper surface 12 of the leadframe 4. This arrangement is sometimes referred to as a source down arrangement or a flip chip arrangement.

The source electrode 8 is mounted on, and electrically connected to, a source portion 13, denoted S1, of the leadframe 4 by a diffusion solder bond not illustrated in the figures. The gate electrode 9 is mounted on, and electrically connected to, a physically separate first gate portion 14, denoted G1, of the leadframe 4 which is positioned adjacent the source portion 13. The gate electrode 9 is mounted on the gate portion 14 of the leadframe 4 by diffusion solder bond not illustrated in the figures.

The second MOSFET device 3 is mounted on the second side 10 of the first MOSFET device 2 to form a stack and provides the High Side Switch of the half-bridge circuit. The second MOSFET device 3 is laterally smaller than the first MOSFET device 2.

The first power MOSFET device 2 further comprises an electrically conductive via 15 positioned in a peripheral edge region 16 of the semiconductor body 6. The arrangement of the electrically conductive via 15 is illustrated in more detail in FIG. 2. The electrically conductive via 15 is, in this embodiment, positioned in the opposing edge region of the semiconductor body to the source electrode 8. The gate electrode 9 is positioned in approximately the lateral centre of the first side 7. The drain electrode 11 extends over the majority of the second side 10 apart from in the peripheral edge region 16 in which the via 15 is positioned.

The electrically conductive via 15 is provided by a through-hole 16 which extends from the first side 7 to the second side 11 of the semiconductor body 6. An isolation layer 18 is positioned on the side walls 17 of the through-hole 16 and on the first surface 7 and second surface 11 immediately surrounding, or contiguous, the through-hole 16. The isolation layer 18 consists essentially of $SiO_2$ and has a thickness of 200 nm. An electrically conductive mass 19 essentially fills the through-hole 16 and extends from the first side 7 to the second side 11 of the silicon semiconductor body 16. The electrically conductive mass 19 which provides a through contact in rod form consists essentially of aluminium.

A first contact pad 20 which is laterally larger than the through-hole 19 and the electrically conductive mass 19. The first contact pad 20 is positioned on the electrically conductive mass 19 and on the second surface 11 in regions adjacent the through-hole 16. Similarly, a second contact pad 21 is positioned on the electrically conductive mass 19 and on the first surface 7 of the semiconductor body 6. The first contact pad 20 and second contact pad 21 are electrically isolated from the semiconductor body 6 by the isolation layer 18. Each contact pad 20, 21 is laterally larger than the through-hole 16. A layer of diffusion solder 22 is positioned on the outer surface second contact pad 21 to enable the second contact pad 21 to be mounted on the leadframe 4.

The electrically conductive via 15 is galvanically isolated by the isolation layer 18 from the semiconductor body 6 of the first MOSFET device 2 and from the device structures within the semiconductor body 6 of the MOSFET device 2 which provide the transistor cells. The electrodes 8, 9, and 11 positioned on the first 7 and second 11 surface of the semiconductor body 6 are physically separate from, and not in the electrical contact with, the via 15. The via 15 is galvanically isolated from the electrodes 8, 9 and 11 by the relative positions of the electrodes with respect to the via 15 as well as by the isolation layer 18.

The electrically conductive via 15 provides a vertical rewiring structure through the MOSFET device 2 which is galvanically independent of the MOSFET device 2.

The first contact pad 21 of the electrically conductive via 15 is mounted on a second gate portion 23, denoted as G2, of the leadframe 4. The second gate portion 23 is physically separate from the other portions of the leadframe 4. The MOSFET device 2, therefore, has lateral dimensions or an area such that it extends over three portions of the leadframe 4, denoted in FIG. 1 as S1, G1 and G2.

The second MOSFET device 3 comprises a first surface 24 on which a source electrode 25 and gate electrode 26 are positioned. The opposing second surface 27 of the second MOSFET device 3 comprises a drain electrode 28 which extends over essentially the whole of the second surface 27. The second MOSFET 3 does not have a via. The second MOSFET device 3 is mounted with its first side 24 facing the second side 11 of the first MOSFET device 2 and is mounted on the second side 10 of the first MOSFET device 2 to form a stack. The source electrode 25 is mounted or on, and electrically connected to, the drain electrode 11 of the first MOSFET device 2.

The source electrode 25 of the second MOSFET device 3 is mounted on, and electrically connected to, the drain electrode 11 of the first MOSFET device 2 by a soft solder joint not illustrated in the figures. The gate electrode 26 of the second MOSFET device 3 is mounted on, and electrically connected to, the first contact pad 20 of the electrically conductive via 15 positioned in the semiconductor body 6 of the first MOSFET device 2 by a soft solder joint not illustrated in the figures.

The gate electrode 26 of the second MOSFET device 3 can, therefore, be electrically accessed by the second gate portion 23, G2, of the leadframe 4 by means of the electrically conductive via 15. The electrically conductive via 15 enables the gate electrode 26 of the upper MOSFET device 3 of the stack to be electrically accessed from a contact pad 21 positioned on the opposing first side of the lower MOSFET device 2 of the stack independently of the electrical access to the other electrodes 8, 9, 11 of the first MOSFET device 2.

The via 15 positioned in the lower MOSFET device 2 of the stack provides a simple rewiring structure from the gate electrode 26 of the upper MOSFET device 3 to the leadframe 4 positioned on the opposing side of the lower MOSFET device 2. Bond wires or other electrical connections such as a contact clip are not used to provide a rewiring from the gate electrode 26 to the leadframe 4. Such connections occupy space in regions adjacent to the side faces of the MOSFET devices 2, 3. Since these connections are replaced by the via 15, space within the electronic component can be saved. Consequently, MOSFET devices with a larger lateral area can be accommodated within a component with given outer dimensions and a component with an improved performance may be provided.

The lower MOSFET device 2 is, therefore, mechanically supported by the second gate portion 23 of the leadframe 4 although it is not electrically connected to and, in fact, is galvanically isolated from, the second gate portion 23.

The upper surface 12 of each of the portions of the leadframe 4 is essentially coplanar. The source electrode 8, gate electrode 9 and first contact pad 21 are, therefore, provided with a height which is essentially the same to enable the first side 7 of the MOSFET device 2 to be reliably mounted on the three portions of the leadframe 4.

The electronic component 1 also comprises further electrically connections to complete the half-bridge circuit. A first contact clip 30 extends from, and electrically connects, the drain electrode 11 positioned on the upper second surface 10 of the lower MOSFET device 2 to a fourth portion 29, denoted in FIG. 1 as S1/D2, of the leadframe 4. The first contact clip 30 also electrically connects the source electrode 25 of the upper MOSFET device 3 to the fourth portion 29 of the leadframe 4. The first contact clip 30 is mounted on the drain electrode 11 and leadframe 4 by a soft solder joint in each case.

A second contact clip 31 extends from, and electrically connects, the drain contact 28 of the second MOSFET device 3 to two portions 32, 33 of the leadframe 4 denoted D2. The second contact clip 31 comprises a central flat web portion 35 and two peripheral rim portions 36. A peripheral rim portion 36 extends from each of two opposing side edges of the flat web portion 35 downwards towards the upper surface 12 of the leadframe 4 and extends into a foot region. The lower surface of the foot region of the peripheral rim portion 36 is mounted on, and electrically connected to, the two outermost portions of the leadframe 4. The flat web portion 35 is mounted on the drain electrode 28 of the second MOSFET device 3 and to the upper surface 12 of the two portions 32, 33 of the leadframe 4 by a soft solder joint in each case.

In this embodiment, the electronic component 1 further comprises plastic encapsulation material 34 which encapsulates the two MOSFET devices 2, 3, the two contact clips 30, 31 and the upper surface 12 of the leadframe 4. The lower surfaces 5 of the six portions of the leadframe 4 remained uncovered by the plastic encapsulation 34 and provide the surface mountable outer contact surfaces of the electronic component 1.

In a further embodiment not illustrated in the figures, the upper surface of the flat web portion 35 of the second contact clip 31 remains uncovered the plastic encapsulation 34.

The electrically conductive via 15 in the first MOSFET device 2 may be fabricated using a method as taught in U.S. Pat. No. 5,608,264 issued to Gaul which is hereby incorporated by reference in its entirety. One or more through holes 16 may be produced in the semiconductor body 6 of the MOSFET device 2 by etching. An isolation layer 18 is then deposited on the side walls 17 of the through-holes 16 and on regions of the first surface 7 and second surface 11 of the semiconductor body 6 which are contiguous to the through-holes 16. The through-holes 16 may then be filled with a metal and a contact pad 20, 21 deposited on each of the first surface 7 and the second surface 11, respectively. Each contact pad is positioned on, and electrically connected to, the metal positioned in the through-hole 16. The through-hole 16 may be made before the device structures are formed within the semiconductor body 6 by ion-implantation and before the electrodes are deposited on the first 7 and second surfaces 11. The contact pads 20, 21 of the electrically conductive via 15 and the electrodes of the transistor of the first MOSFET device 2 may be conveniently deposited at the same time.

The electronic component 1 is assembled by providing a leadframe 4, a first MOSFET device 2 including an electrically conductive via 15 and a second MOSFET device 3. The leadframe 4 is heated to a temperature above the melting point of the diffusion solder layer which is positioned on the outermost surface of the source electrode 8, gate electrode 9 and first contact pad 21.

The first MOSFET device 2 is positioned with its first side 7 facing towards the upper surface 12 of the leadframe 4 and the source electrode 8 is brought into surface to surface contact with the source portion 13 of the lead frame 4, the gate electrode 9 with the gate portion 14 and the first contact 21 with the second gate portion 23. Intermetallic phases are formed in the diffusion solder layer due to the reaction of the diffusion solder with material of the upper surface 12 of the lead frame 4, which in this case consists essentially of copper. Since the intermetallic phases have a higher melting point than the temperature at which the diffusion solder process is carried out, the MOSFET device 2 is attached to the leadframe 4 by the solidification of the interface between the source electrode 8, gate electrode 9 and contact pad 21 and the respective portion of the lead frame 4 forming a diffusion solder bond.

The second MOSFET device 3 is arranged with its first surface 24 facing towards the upper second surface 10 of the MOSFET device 2 so that source electrode 25 is positioned over the drain electrode 11 and the gate electrode 26 is positioned above the first contact of the electrically conductive via 15. The source electrode 25 is mounted on, and electrically connected to, the drain electrode 11 by a layer of soft solder and the gate electrode 26 is attached to, and electrically connected to, the first contact pads 20 of the via 15 by a layer of soft solder. In a further embodiment not illustrated in the Figures, the source electrode 25 of the second MOSFET device 3 is mounted on, and electrically connected to, the drain electrode 22 of the first MOSFET device 2 by a diffusion solder bond and the gate electrode 26 is attached to, and electrically connected to, the first contact pads 20 of the via 15 by a diffusion solder bond.

A first contact clip 30 is provided and attached to the edge of region of the drain electrode 11 and the portion 29 of the lead frame 4 by a soft solder layer in each case. The drain electrode 28 of the second MOSFET device 3 is then electrically connected to two drain portions by the use of the second contact clip 31.

The two contact clips 30, 31, the two MOSFET devices 2,3 and the upper surface 12 of the leadframe 4 are embedded in plastic encapsulation material 34 in a transfer molding process.

FIG. 3 illustrates an electronic component 40 according to a second embodiment. Parts of the electronic component 40 which are essentially the same, or perform the same function, as those of the first electronic component are indicated with the same reference numbers and are not necessarily described again.

The second electronic component 40 comprises a vertical power MOSFET device 2 and a control IC chip 41 arranged in a stack. The IC chip 41 is mounted on the second side 11 of the MOSFET device 2. The MOSFET device 2 is similar to the MOSFET device 2 illustrated in FIG. 1 and differs only in that two electrically conductive vias 15 are positioned adjacent one another in a peripheral region 16 of the semiconductor body 6. The two vias 15 are physically separate and galvanically isolated from each other as well as being galvanically isolated from the device structures of the MOSFET device 2 and from the source electrode 8, gate electrode 9, and drain electrode 11 of the MOSFET device 2.

The MOSFET device 2 is mounted with its first side 7 facing towards the upper surface 12 of the leadframe 4 so that the source electrode is mounted on, and electrically connected to a source portion 13 and the gate electrode 9 is mounted on, and electrically connected to, a gate portion 14.

The IC chip 41 has an active surface 42 which comprises two contacts 43. Each contact 43 is mounted on a contact pad 20 positioned on the second side 11 of the MOSFET device 2. Each contact 43 of the IC chip 41 can, therefore, be electrically accessed by means of an electrically conductive via 15. Each contact 43 can be independently electrically accessed from a contact pad 21 positioned on the opposing first side 7 of the MOSFET device 2 and, consequently, from the leadframe 4 positioned underneath the MOSFET device 2. In this embodiment, the electronic component 40 includes a single contact clip 30 which extends between the drain contact 11 of the MOSFET 2 and leadframe 4.

The contact pads 20, 21 positioned on the first side 7 and second side 11, respectively, of the MOSFET device 2 can also provide a lateral rewiring structure between the contacts 43 of the IC chip and the electrically conductive vias 15 and between the electrically conductive vias 15 and portions of the leadframe 4. The first contact pads 21 of the electrically conductive vias 15 are, in each case, mounted on a portion of the leadframe 4 by a diffusion solder bond.

The contact pads 21 including the diffusion solder bond each have a height essentially the same as the height of the source electrode 8 and gate electrode 9 which enables the MOSFET device 2 to be mounted on four portions of the leadframe 4 reliably.

REFERENCE NUMBERS 1 first electronic component
2 first MOSFET device
3 second MOSFET device
4 leadframe
5 outer contact surface
6 semiconductor body
7 first side of MOSFET
8 source electrode
9 gate electrode
10 second side of MOSFET
11 drain electrode
12 upper surface of leadframe
13 source of leadframe
14 first gate portion of leadframe
15 electrically conductive via
16 through-hole
17 side walls
18 isolation layer
19 electrically conductive mass
20 first contact pad
21 second contact pad
22 diffusion solder
23 second gate portion of leadframe
24 first surface of second MOSFET
25 source electrode of second MOSFET
26 gate electrode of second MOSFET
27 second side of second MOSFET
28 drain electrode of second MOSFET
29 drain/source portion of lead frame
30 first contact clip
31 second contact clip
32 second drain portion of leadframe
33 second drain portion of leadframe
34 plastic encapsulation
35 flat web portion
36 peripheral rim portion
40 second electronic component
41 IC chip

What is claimed is:

1. An electronic component comprising two vertical semiconductor power transistors arranged in a stack, comprising:
a first vertical semiconductor power transistor comprising a semiconductor body having a first side and a second side and device structures, at least one first electrode positioned on the first side and at least one second electrode positioned on the second side, wherein the semiconductor body further comprises at least one electrically conductive via, the via extending from the first side to the second side of the semiconductor body and being galvanically isolated from the device structures of the semiconductor body and from the first electrode and the second electrode, and
a second vertical semiconductor power transistor comprising a semiconductor body having a first side and a second side and device structures, at least one first electrode and at least one control electrode positioned on the first side and at least one second electrode positioned on the second side, and
wherein the second vertical semiconductor power transistor is mounted on the second side of the first vertical semiconductor power transistor such that at least one electrode of the second semiconductor transistor is mounted on, and electrically connected to, the via positioned in the first semiconductor power transistor, the electrode of the second semiconductor power transistor being galvanically isolated from the first semiconductor power transistor and being independently electrically accessible from the first side of the first semiconductor power transistor.

2. The electronic component according to claim 1, wherein at least one control electrode is positioned on the first side of the first semiconductor transistor and the second vertical semiconductor power transistor is mounted on the second side of the first vertical semiconductor power transistor, the first electrode of the second semiconductor power transistor being mounted on, and electrically connected to, the second electrode of the first semiconductor power transistor and the control electrode being mounted on, and electrically connected to, the via.

3. The electronic component according to claim 1, wherein the first vertical semiconductor power transistor and the second vertical semiconductor power transistor are configured to provide a half-bridge circuit.

4. The electronic component according to claim 1, wherein the first vertical semiconductor power transistor is the Low Side Switch and the second vertical semiconductor power transistor is the High Side Switch of the half bridge circuit.

5. The electronic component according to claim 1, wherein the first vertical semiconductor power transistor is selected from the group consisting of: a MOSFET, an IGBT and a BJT and the second vertical semiconductor power transistor is selected from the group consisting of: a MOSFET, an IGBT and a BJT.

6. The electronic component according to claim 1, further comprising a leadframe, the leadframe providing outer contact surface of the electronic component, wherein the first electrode of the first vertical semiconductor power transistor is mounted on a first portion of the leadframe and the control electrode of the first semiconductor power transistor is mounted on a first control portion of the leadframe and the via is mounted on a second control electrode portion of the leadframe.

7. The electronic component according to claim 6, wherein the second electrode of the second semiconductor transistor is mounted on, and electrically connected to, the first electrode of the first vertical semiconductor power transistor and the control electrode of the second semiconductor transistor is mounted on, and electrically connected to, the via positioned in the first semiconductor power transistor and is electrically connected to the second control portion of the leadframe.

8. The electronic component according to claim 7, further comprising an electrical connection from the second electrode of the first semiconductor power transistor to a second portion of the leadframe and an electrical connection from the second electrode of the second semiconductor power transistor to a third portion of the leadframe.

9. The electronic component according to claim 1, wherein the via comprises a through-hole positioned in the semiconductor body extending from the first side to the second side and an electrically conductive mass located in the through-hole and extending from the first side to the second side.

10. The electronic component according to claim 1, wherein the via further comprises at least one isolation layer positioned on at least the walls of the though-hole, the electrical isolation layer galvanically isolating the via from the device structures of the semiconductor body.

11. The electronic component according to claim 10, wherein the isolation layer provides a galvanic isolation voltage of 10V to 10 kV.

12. The electronic component according to claim 10, wherein the isolation layer comprises a thickness t, wherein $10\text{ nm} \leq t \leq 10\text{ }\mu m$.

13. The electronic component according to claim 10, wherein the isolation layer comprises one of $SiO_2$, SiNO, BPSG, TEOS and $Si_xH_x$.

14. The electronic component according to claim 10, wherein the isolation layer is further positioned on the first side and the second side of the semiconductor body at least in regions contiguous to the through-hole.

15. The electronic component according to claim 1, wherein the via comprises one of aluminium, an aluminium alloy, copper and a copper alloy.

16. The electronic component according to claim 1, wherein a first contact pad is positioned on the first surface and is in physical and electrical contact with the via and a second contact pad is positioned on the second surface and is in physical and electrical contact with the via.

17. An electronic component, comprising:
at least one first vertical semiconductor power transistor, the vertical semiconductor power transistor comprising a semiconductor body having a first side and a second side and device structures, at least one first electrode and at least one control electrode positioned on the first side and at least one second electrode positioned on the second side, wherein the semiconductor body further comprises at least one electrically conductive via, the via extending from the first side to the second side of the semiconductor body and being galvanically isolated from the device structures of the semiconductor body and from the first electrode, the second electrode and the control electrode, and
a control semiconductor chip comprising at least one chip contact positioned on a first chip surface,
wherein the control semiconductor chip is mounted on the second side of the first vertical semiconductor transistor and the chip contact is mounted on and electrically connected to at least one via, the control semiconductor chip being independently electrically accessible from the first side of the first vertical semiconductor power transistor.

18. The electronic component according to claim 17, further comprising a leadframe, the leadframe providing outer contact surface of the electronic component, wherein the first electrode of the first vertical semiconductor power transistor is mounted on a first portion of the leadframe and the control electrode of the first semiconductor power transistor is mounted on a control portion of the leadframe and wherein the via is mounted on a fourth portion of the leadframe, electrically connecting the control chip to the fourth portion of the leadframe.

19. The electronic component according to claim 17, wherein the via comprises a through-hole positioned in the semiconductor body extending from the first side to the second side and an electrically conductive mass located in the through-hole extending from the first side to the second side.

20. The electronic component according to claim 17, wherein the via further comprises at least one isolation layer positioned on at least the walls of the though-hole, the electrical isolation layer galvanically isolating the via from the device structures of the semiconductor body.

21. The electronic component according to claim 17, wherein the isolation layer provides a blocking voltage of from 10V to 10 kV.

22. The electronic component according to claim 17, wherein the isolation layer comprises a thickness t, wherein $10\text{ nm} \leq t \leq 10\text{ }\mu m$.

23. A semiconductor die comprising a vertical semiconductor power transistor, wherein the vertical semiconductor power transistor comprises:
a semiconductor body having a first side and a second side and device structures;
at least one first electrode and at least one control electrode positioned on the first side; and
at least one second electrode positioned on the second side, wherein the semiconductor body further comprises at least one electrically conductive via, wherein the via extends from the first side to the second side of the semiconductor body and is galvanically isolated from the device structures of the semiconductor body and from the first electrode, the second electrode and the control electrode.

24. The semiconductor die according to claim 23, wherein the via comprises a through-hole positioned in the semiconductor body extending from the first side to the second side and an electrically conductive mass located in the through-hole extending from the first side to the second side.

25. The semiconductor die according to claim 24, wherein the via further comprises at least one isolation layer positioned on at least the walls of the though-hole, the isolation layer galvanically isolating the via from the device structures of the semiconductor body.

26. The semiconductor die according to claim 25, wherein a first contact pad is positioned on the first surface and is in physical and electrical contact with the via and a second contact pad is positioned on the second surface and is in physical and electrical contact with the via.

27. The semiconductor die according to claim 26, wherein a layer of diffusion solder is positioned on the outermost surface of the first contact pad.

28. The semiconductor die according to claim 23, wherein the vertical semiconductor power transistor is selected from the group consisting of a MOSFET, an IGBT and a BJT.

29. The electronic component according to claim 10, wherein the isolation layer comprises a thickness t, wherein $100\ \text{nm} \leq t \leq 1\ \mu\text{m}$.

30. The electronic component according to claim 17, wherein the isolation layer comprises a thickness t, wherein $100\ \text{nm} \leq t \leq 1\ \mu\text{m}$.

* * * * *